US006621439B1

United States Patent
Bugeja

(10) Patent No.: US 6,621,439 B1
(45) Date of Patent: Sep. 16, 2003

(54) METHOD FOR IMPLEMENTING A SEGMENTED CURRENT-MODE DIGITAL/ANALOG CONVERTER WITH MATCHED SEGMENT TIME CONSTANTS

(75) Inventor: Alexander Bugeja, Acton, MA (US)

(73) Assignee: Engim, Inc., Acton, MA (US)

( * ) Notice: Subject to any disclaimer, the term of this patent is extended or adjusted under 35 U.S.C. 154(b) by 0 days.

(21) Appl. No.: 10/133,246

(22) Filed: Apr. 25, 2002

Related U.S. Application Data

(60) Provisional application No. 60/287,318, filed on Apr. 30, 2001.

(51) Int. Cl.[7] ................................................. H03M 1/66
(52) U.S. Cl. ....................... 341/145; 341/153; 341/144
(58) Field of Search ............................... 341/133, 136, 341/144, 145, 153

(56) References Cited

U.S. PATENT DOCUMENTS

| | | | | |
|---|---|---|---|---|
| 5,057,838 A | * | 10/1991 | Tsuji et al. ................. | 341/133 |
| 5,254,994 A | * | 10/1993 | Takakura et al. ............ | 341/153 |
| 5,332,997 A | * | 7/1994 | Dingwall et al. ............ | 341/150 |
| 5,691,579 A | * | 11/1997 | Takiguchi ................... | 307/113 |
| 5,692,512 A | * | 12/1997 | Flachslaender .............. | 600/490 |

* cited by examiner

*Primary Examiner*—Brian Young
*Assistant Examiner*—John B Nguyen
(74) *Attorney, Agent, or Firm*—Edward C. Kwok; MacPherson, Kwok, Chen & Heid LLP.

(57) ABSTRACT

A method for implementing segmented digital-analog converters (DACs) operating in the current mode matches the time constants in the most-significant-bit (MSB) segments to the time constants in the (LSB) least-significant-bit segments, and any intermediate-significant-bit (ISB) segments. The method can be implemented using the simple addition of capacitances or the resizing of transistors in the circuit at appropriate points. The resulting DAC exhibits high dynamic linearity and spurious free dynamic range (SFDR).

28 Claims, 4 Drawing Sheets

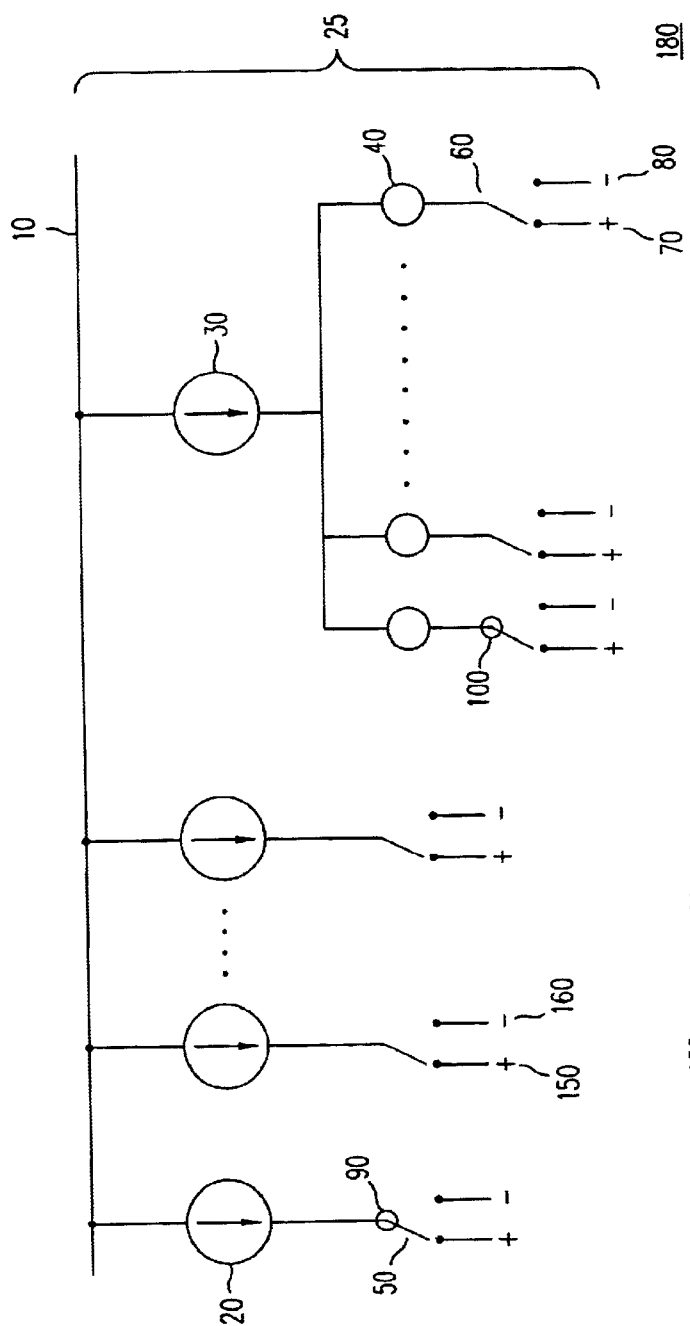
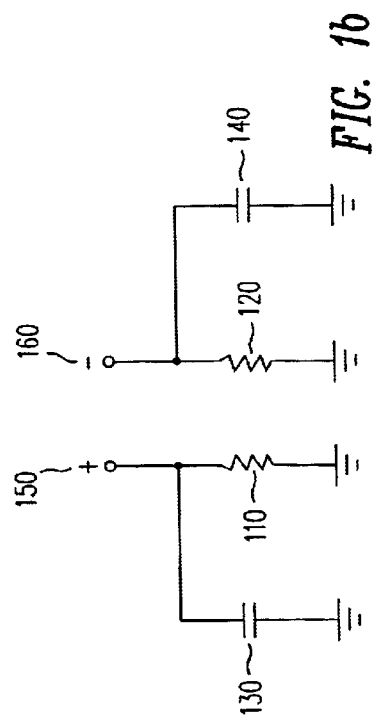
FIG. 1a
FIG. 1b

US 6,621,439 B1

METHOD FOR IMPLEMENTING A SEGMENTED CURRENT-MODE DIGITAL/ANALOG CONVERTER WITH MATCHED SEGMENT TIME CONSTANTS

CROSS-REFERENCE TO RELATED APPLICATIONS

The present application relates and claims the benefit of prior-filed provisional application, Ser. No. 60/287,318, entitled "METHOD FOR IMPLEMENTING A SEGMENTED CURRENT-MODE DIGITAL/ANALOG CONVERTER WITH MATCHED SEGMENT TIME CONSTANTS", filed Apr. 30, 2001.

BACKGROUND OF THE INVENTION

Field of the Invention

This invention relates to digital/analog converters. In particular, the present invention relates to the design of a segmented current-mode digital/analog (D/A) converter having high dynamic linearity.

SUMMARY OF THE INVENTION

According to one embodiment of the present invention, a method for providing a segmented D/A converter includes equalizing a time constant in the MSB segment of the D/A converter and a time constant in the LSB segment. In one embodiment, the equalizing procedure includes adding additional capacitance at a switching terminal. The present invention is suitable for implementation in MOS, bipolar, and other technologies.

In one embodiment of the present invention implemented in an MOS technology, the additional capacitance is provided as capacitance at a drain terminal of a cascode transistor in the MSB segment of the D/A converter and coupled to a fixed potential line, such as a bias voltage. In another embodiment of the present invention, transconductances of switching devices are equalized.

Alternatively, in another embodiment of the present invention, the segmented D/A converter is implemented in a bipolar technology. In that embodiment, the additional capacitance is provided as capacitance at a collector terminal of a cascode transistor in the MSB segment of the D/A converter and coupled to a fixed potential line, such as a bias voltage. In another embodiment of the present invention, transconductances of switching devices are equalized. The method of the present invention finds the smaller one of the time constant in the MSB segment and the time constant of the LSB segment.

A method of the present invention may also equalize a skew time in the MSB segment and a skew time in the LSB segment, or take into consideration necessary correction to secondary sources of parasitic capacitance.

The present invention is better understood upon consideration of the detailed description below and the accompanying drawings.

BRIEF DESCRIPTION OF THE DRAWINGS

FIG. 1(a) is a schematic representation of current mode segmented digital/analog (D/A) converter 180.

FIG. 1(b) illustrates exemplary differential output terminals 150 and 160 of current mode D/A converter 180.

In the present disclosure, like objects that appear in more than one figure are provided with like reference numerals.

DETAILED DESCRIPTION OF THE PREFERRED EMBODIMENTS

Figure 2A:
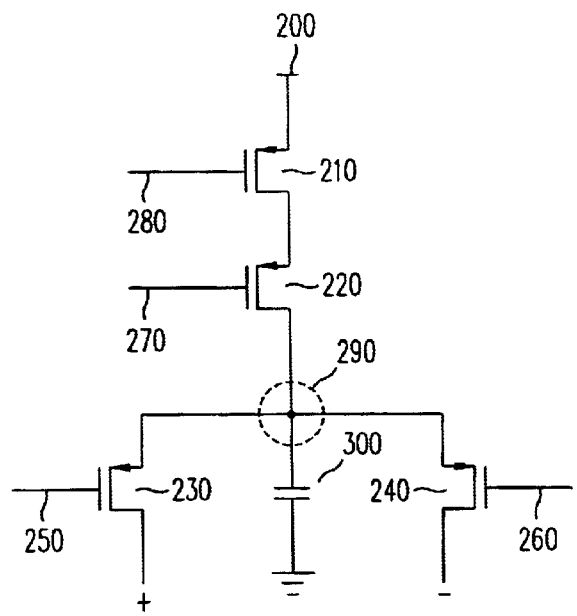
FIG. 2(a) shows, as an example, PMOS cascaded current source 200, which is representative of a current source and a switching element used in current mode segmented D/A converter 180.

The present invention is applicable to a current mode segmented. digital/analog (D/A) converter, such as that shown in FIG. 1(a). FIG. 1(a) is a schematic representation of current mode segmented D/A converter 180, which includes an array of most significant bit (MSB) current sources 20 and an array of least significant bit (LSB) current sources 25. As shown in FIG. 1(a), LSB current sources 25 include driving device 30 and current divider array 40. MSB current sources 20 and LSB current sources 25 are connected between a fixed potential (e.g., power supply rail 10) and a switching array (e.g., switching array 50 for MSB current sources 20 and switching array 60 for the LSB current sources 25). In current mode segmented D/A converter 180, each element of a switching array provides differential output terminals. In other current mode segmented D/A converters, single-ended output terminals may be provided. In a single-ended output terminal, the output terminal that is not used is referred to as a "dump node".

FIG. 1(b) illustrates exemplary differential output terminals 150 and 160 of current mode D/A converter 180. Differential outputs 150 and 160 typically drive directly an external load, which is illustrated in FIG. 1(b) by load resistors 110 and 120, and capacitors 130 and 140. In many instances, capacitors 130 and 140 are undesirable parasitic capacitors, rather than expressly provided circuit elements.

As is familiar to those skilled in the art, current source arrays may be thermometer or binary encoded. Typically, in segmented current mode D/A converters, thermometer encoding is used in MSB current sources and binary encoding is used in LSB current sources. Such an arrangement compromises between the good monotonicity of a thermometer encoded implementation, and the lower complexity of binary encoding. The present invention is applicable to all segmented current mode D/A converters regardless of the encoding scheme used.

Variations of segmented current mode D/A converters are numerous. For example, the current sources and the switching arrays may be implemented with various devices (e.g., MOSFETs or bipolar transistors). The current sources may take on cascoded forms or other circuit configurations to maximize output impedance, so as to achieve static linearity. In addition, current source 30 may be omitted, such that the LSB current sources directly connect to power supply line or "rail" 10, as in the MSB current sources. Of course, under such an arrangement, LSB current sources include appropriately sized transistors. Further segmentation of the current mode D/A converter is also possible. In one arrangement, an additional segment, known as intermediate significant bits ("ISBs", not shown in FIG. 1(a)) can be provided. The present invention is equally applicable to current mode segmented D/A converters, irrespective of the number of segments present.

FIG. 2(a) shows, as an example, PMOS cascaded current source 200, which is representative of a current source and a switching element used in current mode segmented D/A converter 180. In PMOS cascaded current source 200, the current is determined by current device 210. Cascode device 220 may be provided to maximize static linearity. Switching devices 230 and 240, which are respectively controlled by switching signals 250 and 260, connect to cascode device 220 at critical switching node 290. In an MOS implementation, capacitor 300 at critical switching node 290 is dominated by cascode device 220's parasitic drain capacitance. In a bipolar implementation, the capacitance of a corresponding switching node is dominated by a collector-substrate capacitance. This is because, typically, switching devices 230 and 240 are short channel devices with correspondingly small widths, while the channel length of cascode device 220 (or the channel length of current device 210, if cascode device 220 is absent) is generally non-minimum. As a result, to fit within a fixed voltage headroom constraint, cascode device 220 (or current device 210, if cascode device 220 is absent) is made with correspondingly larger width, resulting in the larger parasitic capacitance.

Figure 2B:
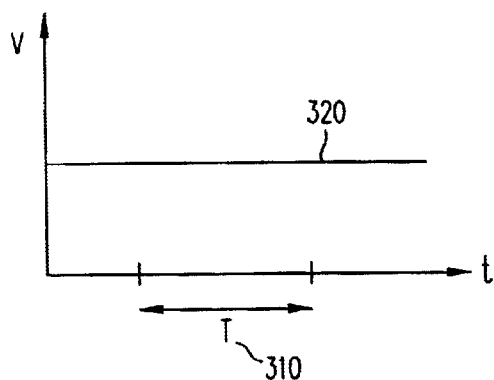
FIG. 2(b) illustrates an ideal condition under which, when switching devices 230 and 240 switch, the voltage at terminal 290 of FIG. 2(a) remains unchanged.
Figure 2C:
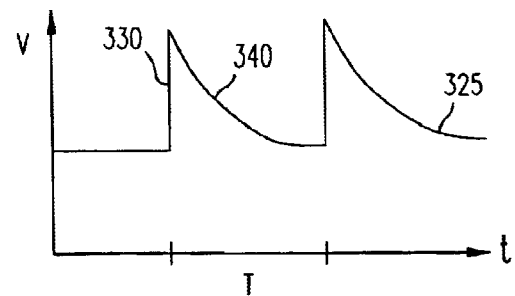
FIG. 2(c) illustrates a typical actual voltage waveform at terminal 290 of FIG. 2(a).

Ideally, when switching devices 230 and 240 switch, the voltage at terminal 290 of FIG. 2(a) should remain unchanged, as illustrated in FIG. 2(b). As illustrated in FIG. 2(b), over time period 310, the voltage at terminal 290 remains at 320, even though switching devices 230 and 240 switch at the beginning of time period 310. In practice, however, the actual voltage waveform at terminal 290 is typically voltage waveform 325 shown in FIG. 2(c). As shown in FIG. 2(c), voltage waveform 325 includes voltage disturbance 330, occurring at the instant when switching devices 230 and 240 switch. In voltage waveform 325, voltage disturbance 330 decays exponentially (to first order) with a time constant RC, where R is the inverse of the transconductance of switching devices 230 and 240 and C is the capacitance of capacitor 300 at terminal 290, if switches 230 and 240 are operated in the active region. (Typically, switches 230 and 240 are operated in the active region to maximize static linearity in the current sources.)

Figure 3A:
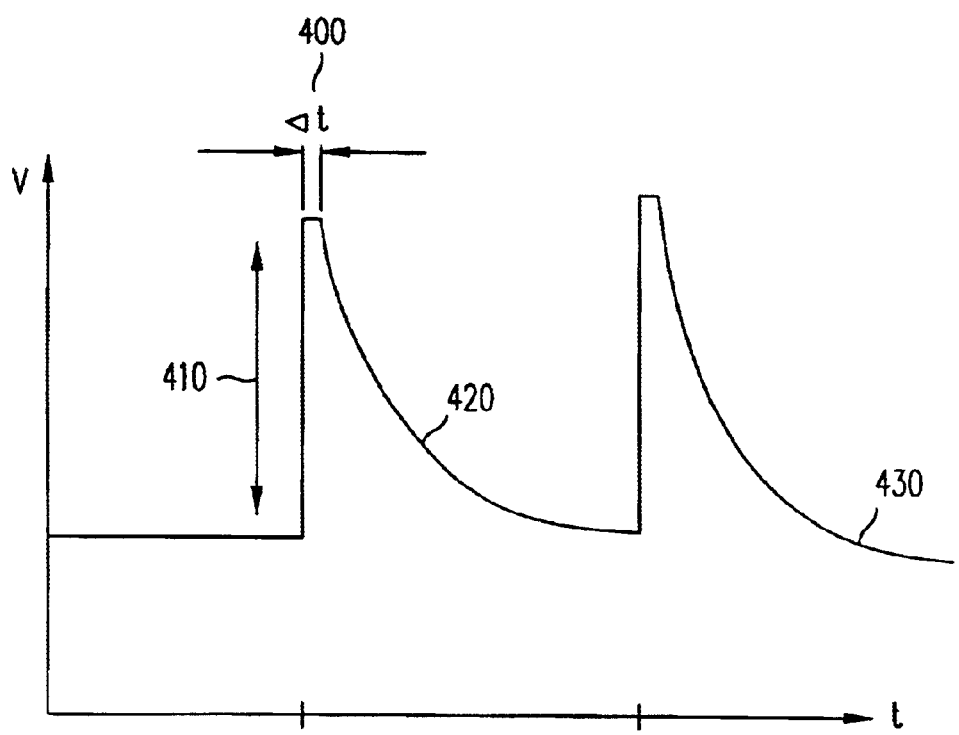
FIG. 3(a) shows voltage waveform 425 at terminal 290 under one model.

At the instant of switching, switching devices 230 and 240 are simultaneously off for interval 400 with duration Δt (FIG. 3(a)), due to the nonzero skew in switching signals 250 and 260 and the latency inherent in switching devices 230 and 240. Thus, if the current in cascode device 220 is constant at value I, the voltage at terminal 290 increases rapidly by voltage 410 (ΔV), which is determined by its capacitance C. This voltage is given by the integral over time of the charging current I divided by capacitance C, or roughly IΔt/C. Thus, under this model, for time t>Δt, portion 420 of voltage waveform 425 at terminal 290 (FIG. 3(a)) is given by:

$$\Delta V(t) = \frac{(I\Delta t)}{C} e^{\frac{-t}{RC}} \quad (1)$$

Equation (1) is valid over duration T, and assumes that the skew effect of charging the capacitance at terminal 290 is the dominant contributor to voltage disturbance 410.

To prevent an unacceptable large change in voltage (i.e., large ΔV), the current source must not shut down completely during switching. Thus, switching time Δt is typically designed to be small (i.e. fast switching). For time t>Δt, the corresponding change in the output current ΔI(t) at the drain terminal of one of switching devices 230 and 240 is given by:

$$\Delta I(t) = \frac{-(I\Delta t)}{RC} e^{\frac{-t}{RC}} \quad (2)$$

Figure 3B:
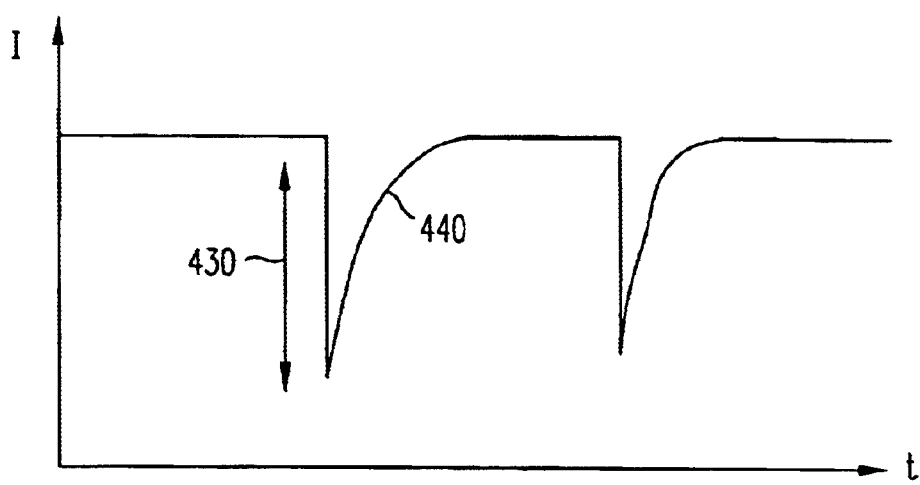
FIG. 3(b) shows the change in output current $\Delta I(t)$ in one of switching devices 230 and 240.

Change in output current, ΔI(t), is illustrated in FIG. 3(b). In equation (2), the negative sign indicates a decrease in the ideal value of current I, represented in FIG. 3(b) by negative current disturbance 430 and subsequent current recovery 440.

In a non-segmented current mode D/A converter, or where all bits in the current mode segmented D/A converter are implemented as a full thermometer type, the total current disturbance $\Delta I_{TOT}(t)$ summed over all current source output terminals is given by:

$$\Delta I_{TOT}(t) = \frac{-n(I\Delta t)}{RC} e^{\frac{-t}{RC}} \quad (3)$$

Where n is the number of current sources switched to the positive or negative outputs (depending on the point of reference), which is proportional to the length of the D/A converter's input word. This total disturbance $\Delta I_{TOT}$, which is provided by constant n multiplied by the input signal at the instant of switching, exhibits a single pole response thereafter (i.e., a linear response). If the RC time constant is slow, the finite decay time may degrade the signal-to-noise ration (SNR) by reducing the signal amplitude while the current recovers. However, the spurious free dynamic range (SFDR) of the D/A converter is not affected. In any event, the SNR is often dominated by the output time constant due to the load.

However, in current mode segmented D/A converter 180, the total current disturbance $\Delta I_{TOT}(t)$ resulting from all bits is given by:

$$\Delta I_{TOT}(t) = -n_{MSB} \frac{(I_{MSB}\Delta t_{MSB})}{RC_{MSB}} e^{\frac{-t}{RC_{MSB}}} - n_{LSB} \frac{(I_{LSB}\Delta t_{LSB})}{RC_{LSB}} e^{\frac{-t}{RC_{LSB}}} \quad (4)$$

Where $n_{MSB}$ and $n_{LSB}$ are respectively the number of MSB bits and the number of LSB bits, $I_{MSB}$ and $I_{LSB}$ are respectively a current in an MSB current source and a current in an LSB current source, $RC_{MSB}$ and $RC_{LSB}$ are respectively the RC time constants for an element in the MSB segment and an element in the LSB segment of the D/A converter, and $\Delta t_{MSB}$ and $\Delta t_{LSB}$ are respectively the switching durations for each element in the MSB segment and the LSB segment of the D/A converter.

The differing time constants $RC_{MSB}$ and $RC_{LSB}$ for the MSB and the LSB segment D/A converter 180 result in the LSB and MSB segments of the D/A converter not being dynamically proportional to each other. This condition can be detrimental to the dynamic performance of a D/A converter circuit, depending on the amount of charge disturbance at the switching terminals. This charge disturbance—which is dependent to first order on the skew of the switch signals—cannot be eliminated.

Thus, a method for matching the time constants formed by the interaction of the switch transconductances and the node capacitances at the switching nodes is desirable. According to one embodiment of the present invention, the $RC_{MSB}$ and $RC_{LSB}$ time constants are made equal to a common value RC, and the skew times $\Delta t_{MSB}$ and $\Delta t_{LSB}$ are also made equal to a common value $\Delta t$. Equalizing the skew times $\Delta t_{MSB}$ and $\Delta t_{LSB}$ to a common value $\Delta t$ can be achieved by sizing the drivers of switching devices 230 and 240 proportional to the sizes of switching devices 230 and 240. Static linearity is assumed here (i.e., the current final values $I_{MSB}$ and $I_{LSB}$ are in their correct proportions). Therefore, according to this embodiment of the present invention, the total current disturbance $\Delta I_{TOT}(t)$ is made to conform to:

$$\Delta I_{TOT}(t) = -\left(\frac{\Delta t}{RC}\right)(n_{MSB}I_{MSB} + n_{LSB}I_{LSB})e^{\frac{-t}{RC}} \quad (5)$$

where $(n_{LSB}I_{LSB}+n_{MSB}I_{MSB})$ is the total D/A Converter current. Since equation (5) provides a total current disturbance $\Delta I_{TOT}(t)$ in the form of a constant multiplied by a single pole response, the total output current is linear. To illustrate a method of the present invention, examples using MOS and bipolar implementation are discussed below.

In the MOS case, switching transconductance R is given by $R=1/(k_1\sqrt{I})$, where $k_1$ is a constant. The capacitance (again, assumed dominated by the cascode device drain parasitic), which scales proportionately with current due to voltage headroom constraints, is given by $C=k_2/I$, where $k_2$ is a constant. Thus, switching terminal time constant has a current dependency given by: $RC=(k_2\sqrt{I})/k_1$. Without applying the method of the present invention, the ratio of an MSB time constant to an LSB time constant is given by:

$$\frac{RC_{MSB}}{RC_{LSB}} = \sqrt{\frac{I_{MSB}}{I_{LSB}}} \quad (6)$$

This ratio in equation (6), which is typically larger than one, can be reasonably handled owing to the square root effect. In particular, since the MSB current is often of the order of 128 times the LSB current, the ratio in equation (6) is approximately 10. To equalize the time constants, the response in the MSB current sources may be slowed down, the responses in the LSB current sources may be speeded up, or both. Thus, according to one embodiment of the present invention, either the MSB time constant $RC_{MSB}$ is made larger, or the LSB time constant $RC_{LSB}$ is made smaller, to equalize the time constants (in addition to matching of the skew times $\Delta t_{MSB}$ and $\Delta t_{LSB}$ by sizing the drivers of switching devices 230 and 240).

Figure 4A:
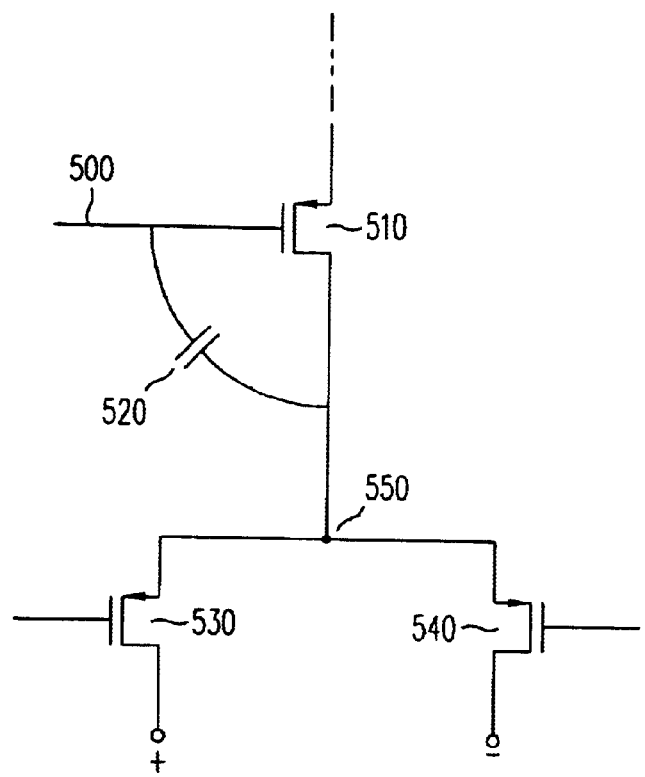
FIG. 4(a) shows additional capacitance, represented by capacitor 520, being provided at switching terminal 550 in the MSB segment of an MOS current mode segmented D/A converter, in accordance with the present invention.

According to one embodiment of the present invention, as illustrated in FIG. 4(a), an additional capacitor 520 is provided at switching terminal 550 in the MSB segment of a current mode segmented D/A converter. (Reducing the parasitic capacitance in the LSB segment is generally difficult.) Here, capacitor 520 is additional only in the sense that its capacitance is incidental to the structure of an operating device (in this case, the drain terminal of the cascode device). The size of capacitor 520 is, however, carefully crafted. As shown in FIG. 4(a), capacitor 520 is coupled to bias line 500. In practice, capacitor 500 can be coupled to any fixed potential conductor, bias line 500 being usually the most conveniently available. A separate fixed potential line, such as a power supply line, should be used if the output impedance of the bias driver is not low enough to reject the disturbances caused by the switching, which would then modulate the output current nonlinearly through the cascode device 510.

Alternatively, time constants $RC_{MSB}$ and $RC_{LSB}$ can be matched via the transconductances of switching devices 530 and 540, by changing the sizes of the switch devices. However, this approach is generally not practicable because the switching devices in the MSB segment would have to be decreased in size by the factor of $I_{MSB}/I_{LSB}$, or the switching devices in the LSB segment would have to be increased in size by the same factor. Decreasing the sizes of switching devices in the MSB segment may cause headroom problems. On the other hand, increasing the sizes of switching devices in the LSB segment would cause the switching terminal capacitance to be dominated by the capacitance in the switching devices, rather than the parasitic capacitance in the drain terminal of the cascode device. The LSB time constant cannot be speeded up to first order in MOSFET implementations unless the switching device sizes are much smaller than the cascode device size. This is because increasing the sizes of the switching devices increases their transconductance only as a square root of size, but their parasitic capacitance goes up linearly when the switching device size exceeds the cascode device size.

Figure 4B:
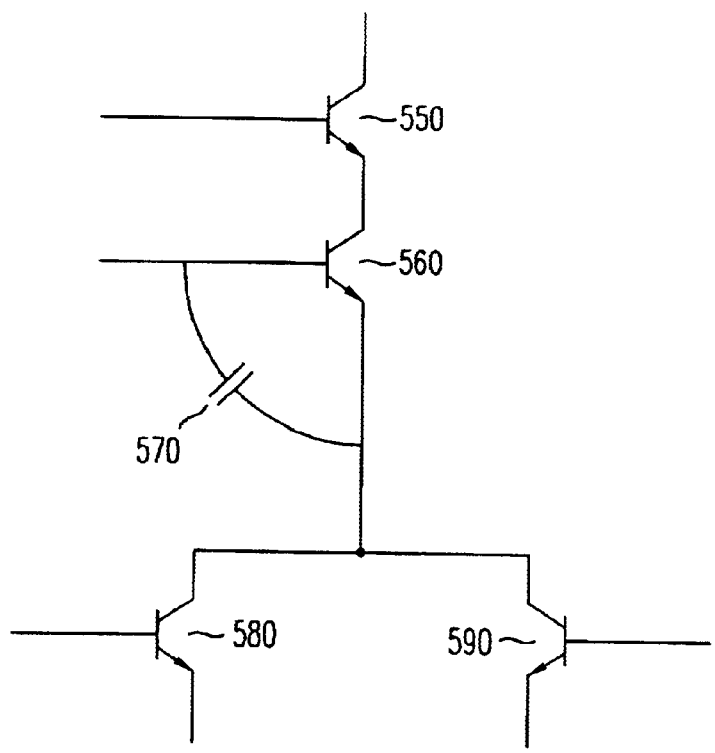
FIG. 4(b) shows additional capacitance, represented by capacitor 570, being provided at switching terminal 580 in the MSB segment of a bipolar current mode segmented D/A converter, in accordance with the present invention.

In a bipolar implementation, the transconductance is linear with current. However, the parasitic capacitance (e.g., the collector-substrate capacitance of the cascode device) is not directly related to current through voltage headroom constraints. Thus, to equalize the RC time constants in a bipolar implementation of a current mode segmented D/A converter, a method of the present invention finds the smaller of the RC time constants—generally, the smaller RC time constant is in the MSB segment of the D/A converter—and adds capacitance to the corresponding current sources, as in the MOSFET case. Such an approach is illustrated by capacitor 570 in FIG. 4(b). FIG. 4(b) shows current device 550 and cascade device 560 coupled to switching devices 580 and 590. Because no control over device transconductance is available in a bipolar implementation case—the transconductance being set by the signal current and not the device size—the capacitance ratio becomes the only design parameter.

Note that capacitance corrections in all cases may need to be modified in absolute size when secondary sources of parasitic capacitance (e.g., the source capacitors of the switching devices and metal line parasitic capacitors) are taken into account. These modifications, which are simple additions or subtractions to the added capacitance, can be performed by those skilled in the art in light of the discussion above, and are therefore not further described here.

The above detailed description is provided to illustrate specific embodiments of the present invention and is not intended to be limiting. Numerous modifications and variations within the scope of the present invention are possible. The present invention is defined by the appended claims.

I claim:

1. A method for providing a segmented D/A converter, comprising:
    dividing the D/A converter into a first segment and a second segment; and
    second equalizing a time constant in the first segment and a time constant in the second segment.

2. A method as in claim 1, further comprising a third segment.

3. A method as in claim 1, wherein the segmented D/A converter is implemented in MOS technology.

4. A method as in claim 3, wherein the equalizing comprises providing additional capacitance at a switching terminal.

5. A method as in claim 4, wherein the additional capacitance is provided as capacitance between a drain terminal of a cascode transistor and a fixed electrical potential.

6. A method as in claim 4, wherein the additional capacitance is provided between a terminal in the first segment of the segmented D/A converter and a fixed electrical potential.

7. A method as in claim 1, wherein the equalizing comprises adjusting the transconductance of switching devices.

8. A method as in claim 4, further comprises adjusting the transconductance of switching devices.

9. A method as in claim 4, wherein the additional capacitance is provided as capacitance between a drain terminal of a current source device and a fixed electrical potential.

10. A method as in claim 1, wherein the segmented D/A converter is implemented in bipolar technology.

11. A method as in claim 10, wherein the equalizing comprises providing additional capacitance at a switching terminal.

12. A method as in claim 11, wherein the additional capacitance is provided as capacitance between a collector terminal of a cascode transistor and a fixed electrical potential.

13. A method as in claim 11, wherein the additional capacitance is provided between a terminal in the first segment of the segmented D/A converter and a fixed electrical potential.

14. A method as in claim 11, wherein the additional capacitance is provided as capacitance between a drain terminal of a current source device and a fixed electrical potential.

15. A method as in claim 1, further comprising equalizing a skew time in the first segment and a skew time in the second segment.

16. A method as in claim 1, wherein the equalizing comprises correcting secondary sources of parasitic capacitance.

17. A segmented D/A converter, comprising a first segment and a second segment in which a time constant in the first segment and a time constant in the second segment are substantially equal.

18. A segmented D/A converter as in claim 17, wherein additional capacitance at a switching terminal is provided to equalize the time constant in the first segment and the time constant in the second segment.

19. A segmented D/A converter as in claim 17, implemented in MOS technology.

20. A segmented D/A converter as in claim 18, wherein the additional capacitance is provided as capacitance between a drain terminal of a cascode transistor and a fixed electrical potential.

21. A segmented D/A converter as in claim 18, wherein the additional capacitance is provided between a terminal in the first segment of the segmented D/A converter and a fixed electrical potential.

22. A segmented D/A converter as in claim 17, wherein the transconductance of a switching device in the first segment is substantially equal to the transconductance of a switching device in the second segment.

23. A segmented D/A converter as in claim 18, wherein the additional capacitance is provided as capacitance between a drain terminal of a current source device and a fixed electrical potential.

24. A segmented D/A converter as in claim 17, implemented in bipolar technology.

25. A segmented D/A converter as in claim 24, wherein additional capacitance at a switching terminal is provided to equalize the time constant in the first segment and the time constant in the second segment.

26. A segmented D/A converter as in claim 25, wherein the additional capacitance is provided as collector-substrate capacitance coupled to a line of fixed electrical potential.

27. A segmented D/A converter as in claim 17, wherein a skew time in the first segment and a skew time in the second segment are substantially equal.

28. A segmented D/A converter as in claim 17, further comprising a third segment.

* * * * *